United States Patent
Hughes et al.

(10) Patent No.: US 6,777,989 B2
(45) Date of Patent: Aug. 17, 2004

(54) GENERATION OF SYNCHRONIZED CLOCKS TO MULTIPLE LOCATIONS IN A SYSTEM

(75) Inventors: Rodney A. Hughes, Tacoma, WA (US); Michael S. Foster, Federal Way, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/140,144

(22) Filed: May 7, 2002

(65) Prior Publication Data

US 2003/0210082 A1 Nov. 13, 2003

(51) Int. Cl.[7] .................................................. H03L 7/00
(52) U.S. Cl. ........................ 327/141; 327/144; 327/176
(58) Field of Search ................................ 327/141, 175, 327/176, 564, 565

(56) References Cited

U.S. PATENT DOCUMENTS

| | | | | |
|---|---|---|---|---|
| 4,940,904 A | * | 7/1990 | Lin ............................. | 327/256 |
| 5,365,119 A | * | 11/1994 | Kivari ......................... | 327/115 |
| 5,394,443 A | * | 2/1995 | Byers et al. ................. | 375/371 |
| 5,422,915 A | * | 6/1995 | Byers et al. ................. | 375/357 |
| 5,430,397 A | * | 7/1995 | Itoh et al. ................... | 326/101 |
| 5,500,627 A | * | 3/1996 | Hulsing, II ................. | 331/1 A |
| 5,506,878 A | * | 4/1996 | Chiang ........................ | 377/39 |
| 5,548,620 A | | 8/1996 | Rogers ........................ | 375/354 |
| 5,598,113 A | * | 1/1997 | Jex et al. ....................... | 326/94 |
| 5,896,055 A | * | 4/1999 | Toyonaga et al. ............ | 327/295 |
| 5,953,386 A | * | 9/1999 | Anderson .................... | 375/376 |

* cited by examiner

Primary Examiner—Timothy P. Callahan
Assistant Examiner—An T. Luu
(74) Attorney, Agent, or Firm—Harness Dickey & Pierce P.L.C.

(57) ABSTRACT

A system and method for providing synchronous clocking allows for precise control of the phase relationship of the clocking signals to thereby provide accurate duty cycles for proper system operation. A digital logic circuit, such as a D-type flip-flop, is provided with a phase signal and clock signal having a frequency relationship. The output of the digital logic circuit is a function of the phase signal and clock signal. The synchronous output may be provided to multiple locations within a system to allow for a synchronous local clock in each of the locations.

21 Claims, 2 Drawing Sheets

GENERATION OF SYNCHRONIZED CLOCKS TO MULTIPLE LOCATIONS IN A SYSTEM

FIELD OF THE INVENTION

The present invention relates generally to synchronous electronic systems, and more particularly to generating and distributing synchronous clocks across a system to provide a reliable synchronous clock with a precise duty cycle.

BACKGROUND OF THE INVENTION

Clocks used for providing timing at multiple locations in a synchronous system, such as, for example, in an electronic circuit board configured as a backplane, must have a precisely controlled phase relationship and accurate duty cycle (e.g., fifty percent duty cycle) to provide proper operation. Specifically, if a proper phase relationship is not provided with respect to control (i.e., clocking) signals used to control different components of the system, the system will be unable to provide proper operation, and in particular, the data output may not be valid (i.e., unreliable). For example, the signals provided at different locations within the system may be out of phase because of differences in timing during power up initialization, due to jitter, or electronic noise.

Known systems attempt to solve the problem of non-synchronized control signals provided at various locations within a system using T-type type flip-flops or similar digital logic circuits. These flip-flops include a single input, to which a clocking signal is applied to trigger the output between two states (i.e., high and low). However, because power cannot be reliably provided to the various T-type flip-flops in the system (i.e., power turned on at different times), the clock signals at the various locations may be out of phase with each other. Once the signals are out of phase, the system must be reset (i.e., reset all clock signals to flip-flops to provide a known state) in order to synchronize the signals. Further, every time a new T-type flip-flop in the system is activated (i.e., powered up) it is not possible to determine the initial state of the clock of that specific T-type flip-flop. Thus, again, synchronization is not ensured until the system is reset.

Therefore, in these systems, a reset of the T-type flip-flops must be provided each time a glitch occurs, which is not always detected. Further, a reset of the clocking signal to all the T-type flip-flops must be provided on any power restart. An external reset may be used to set all clocks to the same state. However, this adds complications (i.e., control issues) and limitations to the system, as well as cost. Additionally, these known systems require that the reference clock provide a precision duty cycle source (e.g., 50 percent duty cycle) for proper operation. For example, in systems requiring high data transfer rates, both edges of the clock signal are required to gate the data, requiring a precise duty cycle source.

Thus, there exists a need to provide a reliable synchronous clock signal across a system (e.g., clock distribution across a backplane), particularly in a system requiring gating of higher speed data. Further, a precise synchronous clock having a reliable duty cycle must be provided to various locations within the system (i.e., synchronous local clock).

SUMMARY OF THE INVENTION

This present invention provides a device and method for generating a precisely controlled clock signal (i.e., phase and duty cycle) for use in multiple locations within a system, to thereby provide proper operation. For example, in systems requiring high data transfer rates, precision synchronized fifty percent duty cycle clocks at multiple locations within a system are required for proper operation.

Specifically, in one preferred embodiment of the present invention, a control device is provided to allow for synchronized clocking in multiple locations of a system to thereby provide synchronous operation. The control device includes a first input means for receiving a phase reference signal, a second input means for receiving a clock signal, and an output means for providing an output signal based upon the phase reference signal when triggered by the clock signal. The clock signal includes a specific active transition (i.e., active edge) and the output means is preferably triggered by the active transition of the clock signal, and changes its output if the phase reference signal at the active edge has changed from the last active transition. In systems requiring a precise duty cycle (e.g., 50% duty cycle), such as, for example, systems having high data transfer rates needing a precise 50% duty cycle, or a system using both edges of the clock (i.e., a two phase clocked system), the phase reference signal may be configured at one-half the frequency of the clock signal.

The control device may be constructed as a digital logic circuit, such as, for example, an input flip-flop, and more specifically, a D-type flip-flop that is provided at each location in the system requiring a synchronous clock. In this construction, the first input means is configured as a data input of a D type flip-flop and the second input means is configured as a clock input of a D type flip-flop. Further, the flip-flop may have a hold time and wherein a phase relationship between the signals received at the first and second input means is not more than the period of the clock input signal minus the hold time. Further, the phase relationship of output signals based upon the same phase and clock input signals (i.e., with respect to other generated output signals) is determined by the relative transmission line length to the second input means.

In another preferred embodiment of the present invention, a system having a plurality of components in different locations requiring synchronized timing is provided. The synchronous system includes a clock generating means for providing a clock signal, a phase reference generating means for providing a phase reference signal, and a timing means provided at each of the components for synchronizing operation of the components. In particular, the timing means is configured for receiving the clock signal and the phase reference signal and outputting a control signal having a frequency based upon the received clock signal and the phase reference signal. Specifically, the timing means is configured to be triggered by an active transition (i.e., active edge) of the clock signal to thereby provide the control signal.

The phase reference signal and clock signal are preferably each configured at a predetermined frequency (i.e., phase and clock synchronized at some frequency or multiple thereof) and the timing means is adapted to output the control signal based upon the relationship between the phases. In systems requiring a precise duty cycle, such as, for example, systems having high-speed data transfer requiring a precise fifty percent duty cycle, the phase signal is provided at a frequency that is one-half of the clock signal, thus providing a 50% duty cycle. The timing means is configured to provide the control signal to the components to thereby define a duty cycle.

The timing means may be constructed as any suitable digital logic circuit, such as, for example, a flip-flop. In particular, in this construction, the timing means may comprise a D-type flip-flop with a data input adapted for receiving the phase reference signal and a clock input adapted for receiving the clock signal and triggering the D-type flip-flop to provide the control signal based upon the clock signal.

In yet another preferred embodiment of the present invention a method of providing synchronized clocking to multiple locations within a system includes providing a synchronized phase reference signal to the multiple locations, providing a synchronized clock signal to the multiple locations, and outputting a control signal based upon the synchronized phase reference signal triggered by the clock signal. The outputting may be triggered by an active transition (i.e., active edge) of the clock signal.

Each of the phase reference signal and clock signal may have a predetermined frequency (i.e., synchronous signals to provide 50% duty cycle and determined by clock input) and wherein the method further includes configuring the predetermined frequencies to obtain a specific duty cycle. In systems requiring a precise duty cycle, such as a fifty percent duty cycle in high data transfer rate systems, the phase reference signal is provided at one-half the frequency of the clock signal.

The method may include using a D-type flip-flop to receive the synchronized phase reference signal and synchronized clock signal and provide the step of outputting. Further, the step of using a D-type flip-flop may include using a D-type flip-flop at each of the multiple locations requiring local synchronized clocking.

Thus, the present invention provides a device and method for reliably synchronizing various components within a system that may require a precise duty cycle. Using two clocking signals, the present invention ensures synchronized timing that is in phase.

Further areas of applicability of the present invention will become apparent from the detailed description provided hereinafter. It should be understood that the detailed description and specific examples, while indicating the preferred embodiments of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses. Thus, although the application of the present invention as disclosed herein is generally directed to a particular digital logic implementation, it is not so limited, and the present invention may be constructed in other manners according to the following description.

The present invention generally provides for reliably synchronizing various components at different locations within a system to allow for proper system operation. Control signals provided in accordance with the principles of the present invention, in combination with an input device at the different locations, provides precise synchronized clocking with a fixed duty cycle. In particular, the present invention provides a device and method for using two different input signals (i.e., a clock and a phase signal) to generate a precision phase synchronous clock (e.g., 50% duty cycle local clock). This clock is phase synchronous with other similarly generated clocks. For example, the present invention may be used in a synchronous system having multiple devices physically separated where each device requires a clock signal synchronous (e.g., having a 50% duty cycle) to the clocks generated in all other devices. In particular, where each device in the system is supplied the two input signals (i.e., clock and phase) and using an input device (e.g., D-Type flip-flop) a precise phase synchronous clock is generated having a reliable duty cycle (e.g., 50% duty cycle). The clocks generated at each device within the system are thereby synchronized to a known phase relationship independent of power-up sequencing, mode of operation (e.g., test mode), or distribution of the devices. However, before describing the invention in further detail, it is useful to understand a system in which the present invention may be implemented. In particular, this may be further understood with reference to the system shown in FIG. 1.

Figure 1:
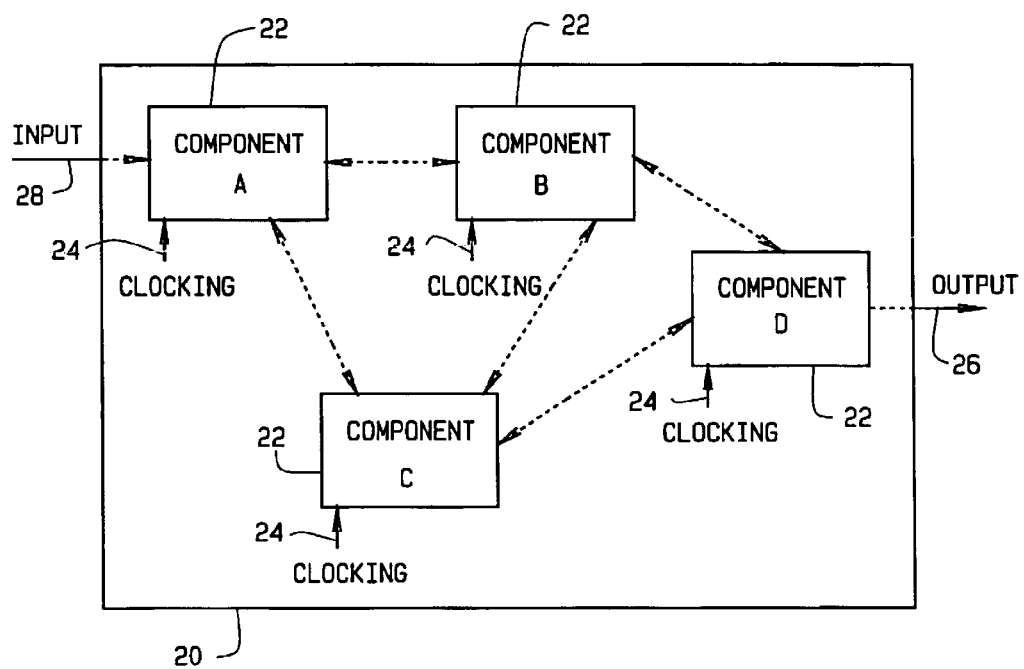
FIG. 1 is a simplified block diagram of a system having components in different locations requiring synchronous clocking signals.

As shown in FIG. 1, a system 20 requiring synchronous operation may include various components 22 communicating data. This may include, for example, within an Application Specific Integrated Circuit (ASIC), where functional modules are spread across the device and there is a desire to minimize the number and size of clock trees. Synchronous operation may also be required, for example, on an electronics module where multiple synchronous functions are located across the module in various components. The present invention will minimize the size and number of tightly controlled clock signals that must be generated and the associated complexity. Further, and as an additional example, synchronous operation may be required in a system of synchronous modules that must be tightly controlled to meet performance requirements. Use of the present invention will reduce system complexity by minimizing the size and number of tightly controlled clock signals that must be distributed across the system. In such a system 20 a synchronous clocking signal 24 is needed for each of the components 22 (i.e., synchronous local clock) to provide synchronous operation. In a system 20 requiring high speed data transfer, precise synchronous clocking signals 24 are required to have a reliable duty cycle for the components 22, and for example, a fifty percent duty cycle. It should be noted that each of the components 22 may be provided in different locations of the system. For example, the components 22 may be located across an electronic circuit board.

Figure 2:
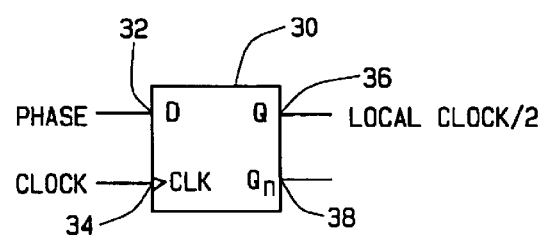
FIG. 2 is one embodiment of a logic device constructed according to the principles of the present invention for providing synchronous clocking signals to various components in different locations in a system.

Having described a system 20 in which synchronous clocking is needed, and in particular, wherein synchronous local clocks may be required for various components 22 provided at different locations within the system, the present invention ensures reliable clocking of the various components 22. Specifically, a control device for implementing the present invention is a digital logic circuit shown in FIG. 2 in exemplary form as a delay (D) type flip-flop 30. As used herein a flip-flop refers to any electronic or digital logic circuit that can alternate or switch between two states (e.g., high and low, or 1 and 0), or any other device providing a one-bit memory. Further, it should be noted that such a flip-flop may be constructed in any known manner using known components, including for example, using transistors in a known configuration. A suitable D-type flip-flop 30 for use in implementing the present invention includes generally any of the 74 series TTL, LSTTL and CMOS versions.

Generally, a D-type flip-flop 30 determines an input value at the time of a specific active clock transition (i.e., active edge). Essentially, the input is provided at the output delayed by one clock period. The D-type flip-flop 30 stores the value of an input when a clocking input makes an active transition (e.g., low to high). A D-type flip-flop 30 is typically provided with a data input (D) 32, a clock input (CLK) 34, an output (Q) 36 and a compliment output (Qn) 38. Clock pulses or signals are provided to the clock input 34 to control the D-type flip-flop 30.

In operation, the output 36 of a D-type flip-flop 30 follows the value of the data input 32 when the clock input 34 makes an active transition (i.e., active edge). During all other time periods, the output 36 remains constant in the state provided at the input 32 during the last active transition of the clock input 34. The following table shows the output 36 for all combinations of the data input 32 and clock input 34:

| D | CLK | Q |
|---|---|---|
| X | 0 | Q |
| X | 1 | Q |
| D | ↑ (clock edge) | D |

In this exemplary construction of the present invention, the inputs of the D-type flip-flop 30 are provided with synchronous control signals. Specifically, the data input 32 is preferably provided with a phase signal and the clock input 34 is preferably provided with a clock signal as described herein. The output 36 is a synchronous signal. Thus, a synchronous local clock may be provided to various components 22 within a system 20 as needed for reliable synchronous clocking, with the data input 32 controlled by a phase signal and the clock input 34 controlled by a clock signal. It should be noted that the synchronous control signals are provided by the system 20, such as, for example, using a crystal controlled oscillator and clock buffers for driving the signal to the components.

The phase and clock signals may be configured according to the particular system requirements. For example, in a system 20 requiring high data transfer rates (e.g., 1 or 2 GBand), a precise fifty percent duty cycle is required for the components 22 to provide uniform timing characteristics for the data being transferred. A control device of the present invention provides precise synchronous local control signals as required.

Figure 3:
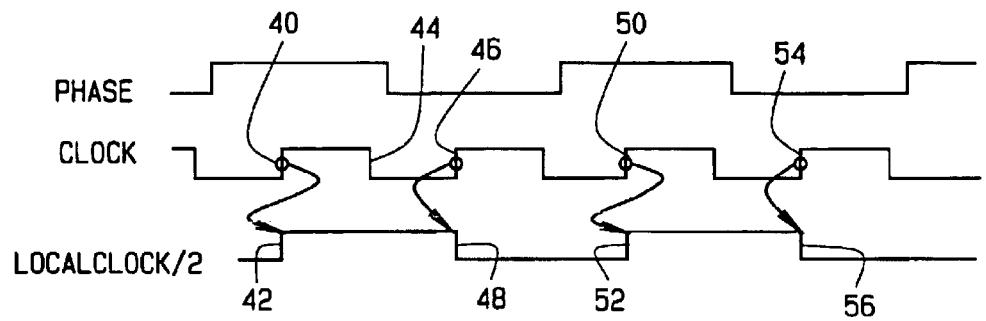
FIG. 3 is an exemplary timing diagram of the present invention for use with the logic device in FIG. 2 providing a fifty percent duty cycle.

Referring to FIG. 3, and an exemplary timing diagram for providing a synchronous fifty percent duty cycle local clock, the two synchronous control input signals, Phase and Clock, are generated and distributed in any known manner to each location having a component 22. The output 36 is provided as a Local Clock/2 signal.

Specifically, and as shown in FIG. 3, a D-type flip-flop 30 provided with the Phase and Clock synchronous inputs will produce a fifty percent duty cycle clock at the output 36. As shown therein, the frequency of the Phase signal is equal to one-half the frequency of the Clock signal.

As shown in FIG. 3, the output 36 may be initially low (i.e. 0), and at the first active transition (i.e., transition from low to high) of the clock input 34 at 40, the Phase signal at the data input 32 is high, causing the output 36 to go high at 42. At the next transition at 44, the Clock signal at the clock input 34 goes from high to low, which is not an active transition, and therefore the output 36 remains the same as that at the last active transition at 42. The next active transition of the Clock signal at 46 causes the output 36 to go low (i.e. 0) at 48 due to the Phase signal at the data input 32 being low. At the next active transition at 50, the Clock signal causes the output to go high at 52 due to the Phase signal at the data input 32 being high. The next active transition of the Clock signal at 54 causes the output to go low at 56 due to the Phase signal at the data input 32 being low. It should be noted that the change in output 36 is provided after a propagation delay of the D-type flip-flop 30 as described herein.

Thus, in operation, the D-type flip-flop 30 samples the Phase reference signal at the data input 32 when clocked by Clock signal at the clock input 34. Based upon the timing diagrams shown in FIG. 3, the frequency of the Local Clock/2 signal provided at the output 36 is exactly one-half the frequency of the Clock signal at the clock input 34, and the duty cycle is exactly fifty percent, as the time period in each state is exactly one period of the Clock input signal. All Local Clock/2 signals provided at the outputs 36 in the system 20 (i.e., at different locations) generated by the same Phase and Clock input signals will have a known phase relationship determined by the transmission line lengths of the Clock signal to the clock input 34 of the associated D-type flip-flops 30.

It should be noted that the D-type flip-flop 30 includes a propagation delay time, also referred to as a set up or hold time. This is the time it takes for the data at the data input 32 to be available at the output 36. Thus, in operation, the phase relationship between Phase and Clock input signals can vary by one, plus or minus ½ period of the Clock signal input time period, minus the set up or hold time for the D-type flip-flop 30.

Figure 4:
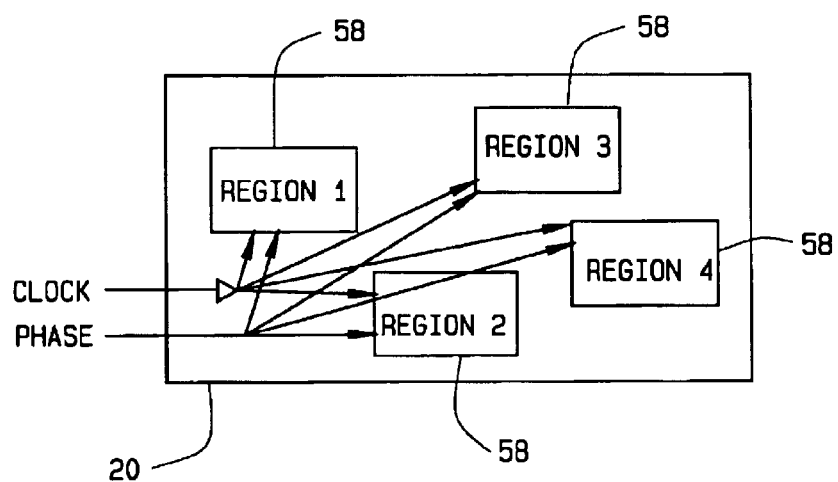
FIG. 4 is a simplified block diagram showing distribution of synchronized clock signals according to the present invention to different locations within a system requiring synchronous local clocks.

Thus, referring to FIG. 4, using a D-type flip-flop 30 or similar digital logic circuit configured according to the principles of the present invention, a synchronous local clock may be provided to different locations or regions 58 of a system 20 using Clock and Phase signals as described herein. Using the synchronous local clocks, an output 36 may be provided that allows for precise control of components 22 within in each of the different locations or regions 58.

Although the present invention has been described in connection with a specific control device using particular control signals, it is not so limited, and different control devices may be used with control signals configured according to the requirements (i.e., synchronization and duty cycle) of the particular system. For example, any type of digital logic may be used to implement the present invention, including, for example, a latch, flip-flop, memory element, transistor combination, among others.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A system for providing synchronized clocking in multiple locations to thereby provide synchronous operation, the system comprising:
   a plurality of control devices with at least one control device at each of the multiple locations, wherein each of the control devices comprising:
   a first input means for receiving a phase reference signal;
   a second input means for receiving a clock signal from a clock, with the phase reference signal and clock signal provided to each of the plurality control devices being the same, wherein a frequency of the phase reference signal has a predetermined proportional relationship with a frequency of the clock signal to obtain a specific duty cycle; and
   an output means for providing an output signal based upon the phase reference signal when triggered by the clock signal, the output signal providing synchronized clocking having a fixed duty cycle to the multiple locations.

2. The system according to claim 1 wherein the clock signal includes an active transition and the output means is triggered by the active transition of the clock signal to provide the output signal based upon the phase reference signal present during the active transition.

3. A system for providing synchronized clocking in multiple locations to thereby provide synchronous operation, the system comprising:
   a plurality of control devices with at least one control device at each of the multiple locations, wherein each of the control devices comprising:
   a first input means for receiving a phase reference signal;
   a second input means for receiving a clock signal from a clock, with the phase reference signal and clock signal provided to each of the plurality control devices being the same; and
   an output means for providing an output signal based upon the phase reference signal when triggered by the clock signal, the output signals providing synchronized clocking in the multiple locations, wherein the phase reference signal is configured at one-half the frequency of the clock signal.

4. The system according to claim 1 wherein the first input means is configured as a data input of a D-type flip-flop and the second input means is configured as a clock input of a D-type flip-flop.

5. The system according to claim 4 wherein the D-type flip-flop has a hold time, and a phase relationship between the signals received at the first and second input means is not more than one period of the clock input signal minus the hold time before or after the output means is triggered.

6. The system according to claim 1 wherein a phase relationship of the output signal to other generated output signals of each control device is determined by the transmission line length to the second input means.

7. A system having a plurality of components in different locations requiring synchronized timing, the system comprising:
   a clock generating means for providing a clock signal;
   a phase reference generating means for providing a phase reference signal, wherein a frequency of the phase reference signal has a predetermined proportional relationship with a frequency of the clock signal to obtain a specific duty cycle; and
   a timing means at each of the components providing synchronized timing and configured for receiving the clock signal and the phase reference signal and outputting a control signal having a frequency based upon the received clock signal and the phase reference signal, the control signal output at each of the components having the same frequency and phase, the timing means further configured to be triggered at an active transition of the clock signal to thereby provide the control signal.

8. The system according to claim 7 wherein the timing means is configured to be triggered by an active transition of the clock signal to thereby provide the control signal.

9. The system according to claim 8 where in the phase reference signal and clock signal each are configured at a predetermined frequency, and the timing means is adapted to output the control signal based upon the relationship between the frequencies.

10. A system having a plurality of components in different locations requiring synchronized timing, the system comprising:
    a clock generating means for providing a clock signal;
    a phase reference generating means for providing a phase reference signal; and
    a timing means at each of the components providing synchronized timing and configured for receiving the clock signal and the phase reference signal and outputting a control signal having a frequency based upon the received clock signal and the phase reference signal, the control signal output at each of the components having the same frequency and phase, the timing means further configured to be triggered at an active transition of the clock signal to thereby provide the control signal, wherein
    the timing means is configured to be triggered by an active transition of the clock signal to thereby provide the control signal,
    the phase reference signal and clock signal each are configured at a predetermined frequency, and the timing means is adapted to output the control signal based upon the relationship between the frequencies, and
    the phase signal is provided at a frequency that is one-half the frequency of the clock signal.

11. The system according to claim 9 wherein the timing means is configured to provide the control signal to the plurality of components to thereby define a duty cycle based upon the predetermined frequency of the phase reference signal and clock signal.

12. The system according to claim 7 wherein the timing means comprises a D-type flip-flop with a data input adapted for receiving the phase reference signal and a clock input adapted for receiving the clock signal and triggering an output of the D-type flip-flop to provide the control signal.

13. A method of providing synchronized clocking to multiple locations within a system, the method comprising the steps of:
    providing a synchronized phase reference signal to the multiple locations;
    providing a synchronized clock signal from a clock to the multiple locations, wherein a frequency of the phase reference signal has a predetermined proportional relationship with a frequency of the clock signal to obtain a specific duty cycle; and
    outputting a control signal having a fixed duty cycle based upon a triggering of the synchronized phase reference signal by the clock signal.

14. The method according to claim 13 wherein the outputting is triggered by an active transition of the clock signal.

15. The method according to claim 13 wherein each of the phase reference signal and clock signal have a predetermined frequency, and further comprising configuring the predetermined frequencies to obtain a specific duty cycle.

16. A method of providing synchronized clocking to multiple locations within a system, the method comprising the steps of:
providing a synchronized phase reference signal to the multiple locations;
providing a synchronized clock signal from a clock to the multiple locations;
outputting a plurality of synchronized control signals based upon the synchronized phase reference signal triggered by the clock signal, wherein each of the phase reference signal and clock signal have a predetermined frequency;
configuring the predetermined frequencies to obtain a specific duty cycle; and
providing the phase reference signal at one-half the frequency of the clock signal.

17. The method according to claim 13 further comprising using a D-type flip-flop to receive the synchronized phase reference signal and synchronized clock signal and providing the output.

18. The method according to claim 17 wherein the step of using a D-type flip-flop further comprises using a D-type flip-f lop at each of the multiple locations requiring synchronized clocking.

19. A control device for controlling the phase relationship of clocking signals in a system to thereby provide synchronous signals to different locations within the system for use in providing a synchronized 50% duty cycle clock, the control device comprising:
triggering means having a first input and a second input, the first and second inputs for triggering an output signal defined by a first input signal at the first input and second input signal at the second input, wherein the first and second input signals have a predetermined frequency relationship such that the frequency of the first input signal is one-half the frequency of the second input signal, and the second input signal is from a clock; and
output means for providing the output signal triggered by the first and second input signals based upon the frequency relationship to thereby provide the synchronized 50% duty cycle clock, and whereby a separate triggering means and output means provided by more than one control device in the different locations within the system to provide synchronous signals based upon the first and second inputs, with the first and second input signals at each of the different locations being the same.

20. The control device according to claim 19 wherein a first input signal is a phase signal and a second input signal is clock signal, and the triggering means is adapted for triggering the output means upon an active transition of the clock signal to provide an output signal based upon the phase signal provided to the first input.

21. A system providing synchronized local clocking at multiple locations, the system comprising:
means for receiving a phase reference signal at each of the multiple locations;
means for receiving a clock signal from a clock at each of the multiple locations, wherein a frequency of the phase reference signal has a predetermined proportional relationship with a frequency of the clock signal to obtain a specific duty cycle; and;
means for outputting a synchronous local clock at each of the multiple locations based upon a triggering of the phase reference signal by the clock signal.

* * * * *